United States Patent

Magazzú

[19]

[11] Patent Number: 5,977,811
[45] Date of Patent: Nov. 2, 1999

[54] SHIFT LEVEL CIRCUIT FOR A HIGH SIDE DRIVER CIRCUIT

[75] Inventor: Antonio Magazzú, Messina, Italy

[73] Assignee: STMicroelectronics S.r.l., Agrate Brianza, Italy

[21] Appl. No.: 08/893,246

[22] Filed: Jul. 15, 1997

[30] Foreign Application Priority Data

Jul. 16, 1996 [IT] Italy .................................. MI96A1465

[51] Int. Cl.⁶ ........................................................ H03L 5/00
[52] U.S. Cl. ............................. 327/333; 327/538; 323/317
[58] Field of Search .................................. 327/53, 65, 66, 327/333, 434, 403, 563, 538; 323/315–317

[56] References Cited

U.S. PATENT DOCUMENTS 5,200,654  4/1993  Archer ..................................... 327/362
5,754,076  5/1998  Kimura ................................... 327/563

*Primary Examiner*—Kenneth B. Wells
*Assistant Examiner*—Minh Nguyen
*Attorney, Agent, or Firm*—Seed and Berry LLP; David V. Carlson

[57] ABSTRACT

A translator circuit for a drive circuit of a power transistor connected to an electric load. The translator circuit includes a first current generator placed between a supply voltage reference and an input terminal of the drive circuit, a controlled switch placed between the input terminal and a ground reference, and a second current generator interposed between the controlled switch and the ground reference. The translator circuit further includes a circuit leg in the form of a current mirror connected in parallel with the second current generator. The translator circuit avoids phenomena of false switching.

20 Claims, 2 Drawing Sheets

SHIFT LEVEL CIRCUIT FOR A HIGH SIDE DRIVER CIRCUIT

TECHNICAL FIELD

The present invention relates to a shift level or translator circuit for a drive circuit of the high side driver type.

BACKGROUND OF THE INVENTION

As is well known, a number of applications in the electronic field require a regulation of a current in an electric load. In most cases, the electric load current is regulated by means of a power transistor which may be either of an integrated type or a discrete type. The power transistor, in turn, is driven by means of an integrated drive circuit, referred to as a high side driver.

A shift level or translator circuit is usually associated with high side driver circuits for converting a drive signal, being referred to a respective signal ground, to a drive signal which is referred to a signal ground of the integrated drive circuit. A good translator circuit allows signal propagation times to be minimized, and a propagation of a power on/off signal to be substantially symmetrized.

In certain applications, e.g. switching converters, it is especially important that the switching edges of the power transistor be quite small, so as not to impair the converter efficiency. In addition, false switchings of the power transistor may occur because the ground for the drive circuit is coincident with the source terminal of the power transistor, so that, with the potential at the source terminal varying rapidly, the drive signal should be able to move at the same rate.

The state of the art already offers an approach to meeting this requirement. For example, shown in FIG. 1 of the accompanying drawings is a drive circuit 10, according to the prior art, intended for a power transistor M1 of the NMOS type. The circuit 10 is supplied by a voltage Vs of 12 Volts, and provides an output U for driving the control terminal of the power transistor M1. The power transistor M1 is connected between a supply voltage reference Vcc and one end of an electric load 13. This end is coincident with a signal ground reference of the circuit 10 where a potential GND_driver is presented.

A translator circuit 11 is associated with the circuit 10 and utilizes two current generators 14 and 15 generating currents I1 and I2, respectively. Specifically, the translator circuit 11 comprises a transistor A of the NMOS type which has its source terminal connected toward a signal ground, through the first generator 14 of the current I1. The drain terminal of the transistor A is connected to an input terminal IN of the drive circuit 10 and to the second generator 15 of the current I2. A signal DRIVE_high is applied to this input terminal IN, while a control terminal G of the transistor A receives a signal DRIVE_low.

The transistor A basically functions as a switch. With the switch in the open state, the current I1 is zero, and the signal DRIVE_high takes a value which equals the combined values of the ground GND_driver of the circuit 10 and the voltage Vs.

On the other hand, when the switch A in the closed state, the current I1 is larger than the current I2, and the potential DRIVE_high at the input terminal IN matches that GND_driver of the ground reference of the circuit 10. In this situation, the power transistor M1 is forced to the 'on' state.

While being in many ways advantageous and essentially achieving its objective, this prior approach is still beset with a risk of false switchings. In fact, upon closing the switch A, the power-on information is transmitted to the power transistor M1, thereby causing it to conduct. The potential at the source terminal of the power transistor M1 rises toward the value of the supply voltage Vcc. This change takes place quite rapidly and results in the current I2 being increased, since the current generator 15 is implemented in the form of a current mirror structure 12, as shown in FIG. 2.

The current mirror 12 comprises a pair of transistors, Ma and Mb, of the PMOS type having their respective control terminals connected together. The transistor Ma is in diode configuration. The dimensional ratios between the transistors Ma and Mb are governed by a parameter k of proportionality, with the dimensions of Mb being k times those of Ma. The gate terminal of the transistor Ma has a first parasitic capacitance C1 toward the source terminal, and a second capacitance C2 toward ground. Accordingly, as the potential at the source terminals moves very rapidly, the gate-source voltage drop across the transistor Ma increases rapidly with respect to the steady-state value of a quantity given by the capacitive divider C1-C2.

Thus, when the power transistor M1 is turned on, the current I2 will be far above its steady-state value, and may even exceed the value of the current I1. Therefore, the node N is charged up to a potential Vcc+Vs, and the output from the circuit 10 forces the power transistor M1 to the 'off' state, causing a false or undesired switching.

The problem might be circumvented by arranging for the gate-source capacitance C1 to be much higher than the gate-ground capacitance C2. However, this would entail integration of large-size capacitors in the semiconductor, and consequently, pose well-recognized problems in terms of circuit area occupation.

Alternatively, the current I1 could be rendered much larger than the current I2; but this method has a serious drawback in that it introduces asymmetry in the propagation times of the power on/off signals for the power transistor M1.

Other possible solutions are based on highly complicated and expensive circuit structures involving the use of memory elements.

SUMMARY OF THE INVENTION

According to principles of the present invention, a translator circuit for a drive circuit controlling a power transistor is provided which has such constructional and functional features as to overcome the aforementioned drawbacks with which prior proposals are beset.

The solution on which this invention is based is to have a current, of either of the current generators incorporated into the translator circuit, mirrored to derive another current which is the sum of the mirrored current plus a contribution of a predetermined value. In this way, the current increase brought about by a rise in a source potential of the power transistor is compensated for by a corresponding increase of the other current, thereby preventing false switchings.

Based on this solution a translator circuit according to an embodiment of the invention is described. The translator circuit has a first current generator placed between a supply voltage reference and an input terminal of the drive circuit, a controlled switch placed between the input terminal and a ground reference, and a second current generator interposed between the switch and the ground reference. The translator circuit also comprises a circuit leg in the form of a current mirror which is connected in parallel with the current generator connected toward the ground.

The features and advantages of the translator circuit according to the present invention will be apparent from the following detailed description of an embodiment thereof, given by way of a non-limitative example with reference to the accompanying drawings.

DETAILED DESCRIPTION OF THE INVENTION

Figure 1:
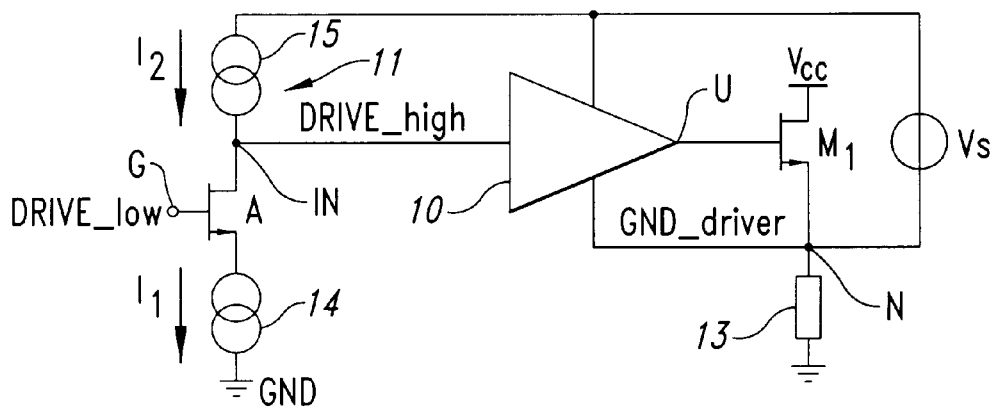
FIG. 1 shows diagramatically a drive circuit for a power transistor having a conventional translator circuit.
Figure 2:
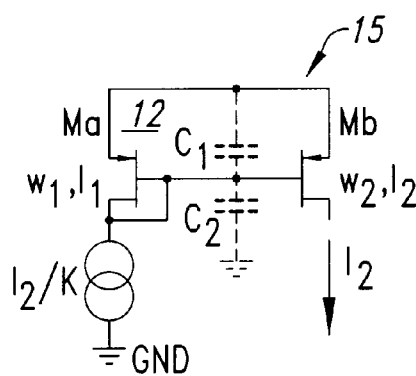
FIG. 2 is a diagrammatic detail view of the translator circuit shown in FIG. 1.
Figure 3:
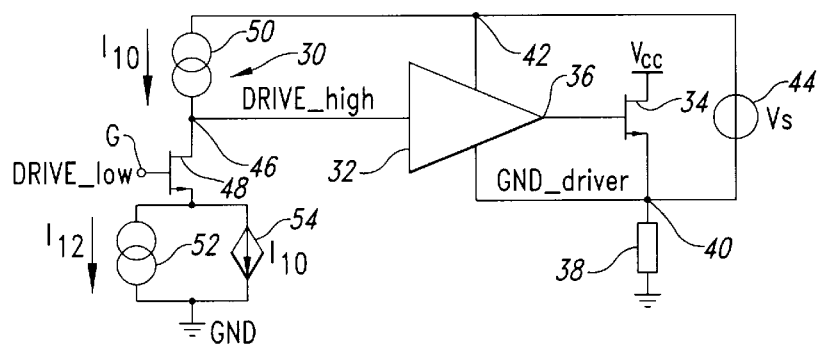
FIG. 3 shows diagramatically a drive circuit for a power transistor having a translator circuit according to a first embodiment of the present invention.

Referring to the drawing views, and particularly to the example of FIG. 3, generally and schematically shown is a translator circuit 30 according to a first embodiment of the invention and adapted to be associated with a drive circuit 32 for a power transistor 34. The circuit 32 is of the type known as a high side driver, and has an output terminal 36 connected to a control terminal of the power transistor 34, in particular an NMOS transistor. The transistor 34 is connected having drain and source terminals between a first reference potential at a supply voltage Vcc and a node 38 which is coincident with a second reference potential, such as a signal ground for the circuit 32. The node 38 is presented a varying potential GND_driver which is dependent on a voltage drop across a load 40. The circuit 32 is supplied, between a node 42 and the node 38, by a voltage Vs from a voltage generator 44. The circuit 32 has an input terminal 46 to which a control signal DRIVE_high is applied.

Associated with the circuit 32 is the translator circuit 30 according to the first embodiment of the invention. The translator circuit 30 includes a controlled switch formed of a transistor 48 of the NMOS type which is connected between the input terminal 46 of the circuit 32 and a ground reference GND. The ground GND is a signal ground of the circuit 30. The circuit 30 includes a current generator 50 which generates a current I10 and is connected between the power supply node 42 of the circuit 32 and the input terminal 46 of the circuit 32. The current generator 50 is connected essentially to a drain terminal of the transistor 48.

Advantageously, the circuit 30 further includes a second current generator 52, generating a current I12 and being connected between a source terminal of the transistor 48 and the ground GND. Moreover, a current mirror 54 is connected in parallel with the second current generator 52. The current mirror 54 duplicates the value of the current I10 of the first generator 50.

Figure 4:
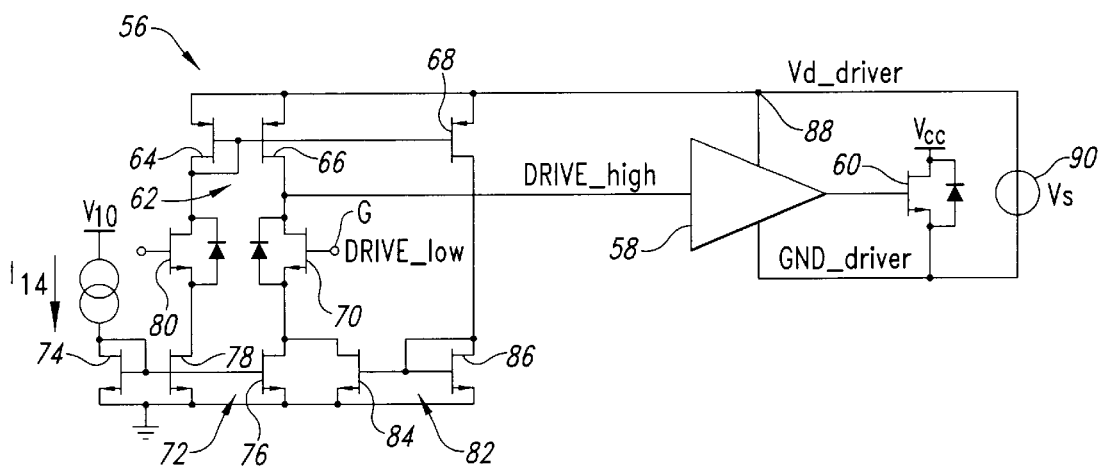
FIG. 4 is a diagrammatic detail view of the translator circuit shown in FIG. 3 according to a second embodiment of the present invention.

FIG. 4 shows a translator circuit 56 according to a second embodiment of the invention. The translator circuit 56 is a detailed representation of one example of the translator circuit 30 shown in FIG. 3. The translator circuit 56 is implemented with BCD60II technology for a drive circuit 58 driving a vertical transistor 60 of the DMOS type which is used as a switch in a switching converter of the step-down type. It can be appreciated, from FIG. 4, that the first generator 50 providing the current I10 shown in FIG. 3 is implemented in FIG. 4 by a current mirror structure 62 comprised of three PMOS transistors 64, 66, and 68. The first, 64, of the PMOS transistors is in diode configuration. A third embodiment of the invention will be described concurrently herewith, by way of example, to include specific dimensions for and voltage levels applied to the elements shown in FIG. 4. The values of the aspect ratio W/L of these transistors are, according to the third embodiment of the invention, 18/6.5 for the transistor 64, 108/6.5 for the transistor 66, and 18/6.5 for the transistor 68. The controlled switch 48 shown in FIG. 3 corresponds to a DMOS transistor 70.

The second generator 52 providing the current I12 shown in FIG. 3 is implemented in FIG. 4 by a current mirror structure 72 comprising NMOS transistors 74 and 76. The values of the aspect ratio W/L of the transistors 74 and 76 are, according to the third embodiment of the invention, of 8/8 and 120/8, respectively. The current flowing through the transistor 76 is essentially equivalent to the current I12 shown in FIG. 3. The transistor 74 is in a diode configuration and is connected to a supply reference voltage V10 via a generator of a current I14. In the third embodiment of the invention the supply reference voltage V10 is 5 volts. The transistor 76 is connected between the transistor 70 and the ground GND.

Also, a transistor 78 is connected to the transistor 64 through a protection transistor 80 having a control terminal at a selected potential value. In the third embodiment of the invention a potential of 5 volts is applied to the control terminal of the transistor 80. A control terminal of the transistor 78 is connected in common with control terminals of the transistors 74 and 76.

Advantageously, a current mirror 82 is formed by a pair of transistors, 84 and 86, of the NMOS type. According to the third embodiment of the invention, the values of their aspect ratio are of 108/7 and 18/7, respectively. The transistor 86 is in a diode configuration and is connected to the transistor 68 of the structure 62.

The transistor 76 of the mirror 72 is connected to the transistor 84 in parallel. Current flowing through the transistor 84 is essentially equivalent to the mirrored current I10 shown in FIG. 3.

The operation of the translator circuit 56 of the second embodiment of the invention will now be described briefly. When the vertical transistor 60 is conducting, the voltage at a node 88 is the sum of the supply voltage Vcc plus the voltage Vs of a generator 90. Maximum values of the supply voltages are of 58V for Vcc and 12V for Vs. Accordingly, the highest value that the voltage at the node 88 can attain is 70V. The NMOS transistors 70 and 80 should be capable of withstanding this voltage value, as should the PMOS transistors 64, 66 and 68. The other transistors are instead implemented with CMOS technology. The CMOS technology is implemented at 12V in the third embodiment of the invention.

Upon turning on the power transistor 60, there occurs an increase in the voltage drop across the diode 64, and correspondingly therewith, a like increase in the current generated from the transistors 66 and 68. The mirroring ratio between the transistors 86 and 84 is same as that between the transistors 68 and 66. Thus, the increased current through the transistor 66 is compensated by a corresponding current increase through the transistor 84.

A signal DRIVE_low applied to a control terminal G of the transistor 70 has a fairly wide dynamic range (0 to 12V), adequate to boost current flow through the switch 70.

The translator circuit according to the principles of the invention does solve the technical problem and has a number of advantages, foremost among which is that the problem of false switchings, that limited the operability of prior translator circuits, can now be overcome. In addition, with the circuit designs proposed in the first and second embodiments of the invention, the consumption of the power transistor drive circuits 32 and 58 can be reduced to values in the range of 40 µA, and of 270 µA with the transistors 34 or 60 turned on. The charge current of the input node 46 is about 120 µA upon turning off. The signal transition times are below 50 ns, these times also taking into account parasitic effects due to the various circuit interconnections.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A translator circuit for driving a power transistor coupled to an electric load, comprising:
   a drive circuit having an output coupled to the power transistor;
   a first current source coupled between a supply voltage reference and an input terminal of the drive circuit;
   a switching transistor having a drain coupled to the input terminal of the drive circuit, a gate coupled to a drive signal and a source;
   a second current source coupled between the source and a ground voltage reference; and
   a third current source coupled between the source and the ground voltage reference, the third current source being controlled by the first current source.

2. The translator circuit of claim 1 wherein the switching transistor is a NMOS transistor and is connected between the input terminal of the drive circuit and the second current source.

3. The translator circuit of claim 1 wherein the third current source is a current mirror circuit connected in parallel with the second current source, the second and third current sources collectively supplying a larger current than the first current source when the switching transistor is conducting.

4. The translator circuit of claim 3 wherein the third current source is a current mirror circuit coupled to the first current source to duplicate a current in the first current source.

5. A method for controlling a power transistor having a control terminal coupled to an output of a drive circuit, the drive circuit having an input terminal, the method comprising:
   providing a first voltage reference by adding a predetermined voltage to a reference voltage of the drive circuit;
   providing a first current to the input terminal of the drive circuit from a first current source coupled between the first voltage reference and the input terminal of the drive circuit;
   coupling the input terminal of the drive circuit to ground through a NMOS transistor coupled in series with a second current source to turn on the power transistor through the drive circuit, the first voltage reference being increased by a voltage coupled through the power transistor;
   increasing the first current in response to the increase in the first voltage reference;
   drawing a second current from the input terminal of the drive circuit through the second current source; and
   drawing a third current from the input terminal of the drive circuit through a third current source, the third current being controlled by the first current.

6. The method of claim 5 wherein:
   the act of coupling the input terminal of the drive circuit to ground comprises applying a signal with a wide dynamic range to a control terminal of the NMOS transistor, the NMOS transistor having a first electrode connected to the input terminal of the drive circuit and a second electrode connected to the second current source; and
   the acts of drawing the second and third currents comprise drawing the second and third currents that collectively are larger than the first current.

7. The method of claim 5 wherein the act of drawing the third current comprises drawing the third current through the third current source coupled to the first current source, the third current being proportional to the first current.

8. A method of providing a converted drive signal to a drive circuit controlling a power transistor comprising:
   coupling an input terminal of the drive circuit to a first voltage reference through a first current source;
   providing a first current to the input terminal of the drive circuit from the first current source;
   coupling the input terminal of the drive circuit to ground through a switching transistor coupled in series with a second current source;
   drawing a second current from the input terminal of the drive circuit through the switching transistor and the second current source; and
   drawing a third current from the input terminal of the drive circuit through a third current source, the third current being controlled by the first current.

9. The method of claim 8 wherein the act of drawing the third current comprises drawing the third current from the input terminal of the drive circuit through the third current source, coupled to the first current source the third current being proportional to the first current, the second and third currents collectively being larger than the first current.

10. The method of claim 8 wherein the switching transistor includes a control terminal for receiving a drive signal, further comprising the act of providing the drive signal with a wide dynamic range.

11. A translator circuit for driving a power transistor coupled to an electric load, comprising a drive circuit having an output coupled to the power transistor, a first current generator coupled between a supply voltage reference and an input terminal of the drive circuit, a controlled switch opening and closing a connection between the input terminal, of the drive circuit and a second current generator coupled between said switch and the ground reference in response to control signals, the translator circuit also including a circuit leg having a third current generator connected in parallel with the second current generator and controlled by the first current generator.

12. A translator circuit according to claim 11 wherein said third current generator is coupled to mirror a current in the first current generator.

13. A translator circuit according to claim 11 wherein said third current generator comprises a pair of NMOS transistors, a first of the NMOS transistors being in a diode configuration.

14. A translator circuit according to claim 13 wherein a mirroring ratio between said pair of NMOS transistors corresponds to a mirroring ratio between a pair of transistors incorporated in said first current generator.

15. A translator circuit according to claim 13 wherein said controlled switch is a MOS transistor having a source terminal connected to a drain terminal of a second transistor in said pair of NMOS transistors.

16. A translator circuit according to claim 11 wherein the power transistor has on/off switching times which are symmetrized by adjusting a ratio between the first and second current generators.

17. A translator circuit according to claim 11, further comprising a protection transistor connected between the first and second current generators.

18. A translator circuit for a drive circuit of a power transistor coupled to an electric load, comprising:
- a first plurality of MOS transistors having sources connected together and gates connected together, a drain of a first MOS transistor of the first plurality being coupled to the gates;
- a second plurality of MOS transistors having sources connected together and gates connected together, a drain of a first MOS transistor of the second plurality being coupled to the gates of the second plurality and to a constant current source, a drain of a second MOS transistor of the second plurality being coupled to the drain of the first MOS transistor of the first plurality;
- a NMOS switching transistor having a gate coupled to a control signal, a source coupled to a drain of a third MOS transistor of the second plurality and a drain coupled to a drain of a second MOS transistor of the first plurality and to an input terminal of the drive circuit; and
- a pair of MOS transistors having sources connected together and gates connected together, a drain of a first MOS transistor of the pair coupled to the gates of the pair and to a drain of a third MOS transistor of the first plurality, a drain of a second MOS transistor of the pair coupled to the drain of the third MOS transistor of the second plurality and to the source of the NMOS switching transistor.

19. The circuit of claim 18 wherein the first plurality comprises PMOS transistors.

20. The circuit of claim 19 wherein the second plurality and the pair comprise NMOS transistors.

* * * * *